United States Patent
Song et al.

(10) Patent No.: US 10,559,501 B2
(45) Date of Patent: Feb. 11, 2020

(54) SELF-ALIGNED QUADRUPLE PATTERNING PROCESS FOR FIN PITCH BELOW 20NM

(71) Applicant: QUALCOMM Incorporated, San Diego, CA (US)

(72) Inventors: Stanley Song, San Diego, CA (US); Jeffrey Xu, San Diego, CA (US); Da Yang, San Diego, CA (US); Kern Rim, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/271,043

(22) Filed: Sep. 20, 2016

(65) Prior Publication Data

US 2018/0082906 A1    Mar. 22, 2018

(51) Int. Cl.
| H01L 21/8238 | (2006.01) |
| H01L 27/092 | (2006.01) |
| H01L 29/10 | (2006.01) |
| H01L 29/66 | (2006.01) |
| H01L 21/3065 | (2006.01) |

(52) U.S. Cl.
CPC .. *H01L 21/823807* (2013.01); *H01L 21/3065* (2013.01); *H01L 21/823821* (2013.01); *H01L 27/0924* (2013.01); *H01L 29/1037* (2013.01); *H01L 29/66795* (2013.01)

(58) Field of Classification Search
CPC ......... H01L 21/823807; H01L 21/3065; H01L 21/823821; H01L 27/0924; H01L 29/1037
IPC ..................................... H01L 21/0337,21/0338
See application file for complete search history.

(56) References Cited

U.S. PATENT DOCUMENTS

| 8,492,228 B1* | 7/2013 | Leobandung ..... H01L 21/82344 257/308 |
| 9,123,659 B1 | 9/2015 | Fu et al. |
| 9,209,038 B2 | 12/2015 | Cantone et al. |
| 9,209,279 B1 | 12/2015 | Zhang et al. |
| 9,287,135 B1 | 3/2016 | Doris et al. |
| 2007/0082437 A1* | 4/2007 | Cheng ............... H01L 29/66795 438/197 |
| 2013/0196508 A1 | 8/2013 | LiCausi |
| 2014/0231913 A1 | 8/2014 | Leobandung |
| 2015/0041812 A1 | 2/2015 | Cheng et al. |
| 2015/0041867 A1* | 2/2015 | Han ................... H01L 29/66795 257/288 |

(Continued)

FOREIGN PATENT DOCUMENTS

EP      2701197 A1    2/2014

OTHER PUBLICATIONS

2nd Written Opinion—PCT/US2017/045966—ISA/EPO—dated Sep. 7, 2018 pp. 1-5.

(Continued)

*Primary Examiner* — Kenneth Parker
*Assistant Examiner* — Long H Le
(74) *Attorney, Agent, or Firm* — Haynes and Boone, LLP

(57) ABSTRACT

A method of producing a FinFET device with fin pitch of less than 20 nm is presented. In accordance with some embodiments, fins are deposited on sidewall spacers, which themselves are deposited on mandrels. The mandrels can be formed by lithographic processes while the fins and sidewall spacers formed by deposition technologies.

14 Claims, 5 Drawing Sheets

(56) References Cited

U.S. PATENT DOCUMENTS

| | | | |
|---|---|---|---|
| 2015/0170973 A1* | 6/2015 | Kim | H01L 21/82382 |
| | | | 438/702 |
| 2015/0243509 A1 | 8/2015 | Chan et al. | |
| 2015/0372107 A1 | 12/2015 | Liu et al. | |
| 2016/0181164 A1 | 6/2016 | Cheng et al. | |
| 2017/0178967 A1* | 6/2017 | Greene | H01L 29/66545 |
| 2017/0317077 A1* | 11/2017 | Doris | H01L 27/0886 |
| 2017/0323944 A1* | 11/2017 | Basker | H01L 29/1087 |

OTHER PUBLICATIONS

International Search Report—PCT/US2017/045966—ISA/EPO—dated Oct. 26, 2017 pp. 1-5.
Written Opinion—PCT/US2017/045966—ISA/EPO—dated Oct. 26, 2017 pp. 1-6.

\* cited by examiner

SELF-ALIGNED QUADRUPLE PATTERNING PROCESS FOR FIN PITCH BELOW 20NM

TECHNICAL FIELD

This application relates to production of FinFET structures with pitch below twenty (20) nanometers (nm).

BACKGROUND

Fin-type field-effect transistors (FinFETs) are increasingly being used to effectively scale integrated circuits. FinFETs, which have a vertical fin structure that function as channels, occupy less horizontal space on the semiconductor substrate and can be formed in logic areas and in memory areas through general semiconductor patterning processes.

However, the continued pressure to further scale integrated circuits has generated a demand for processes for forming smaller and smaller fin structures. The limits of optical resolution in current lithographic processes do not allow for the formation of structures having features small enough for further scaling of integrated circuits. As the demand for feature sizes of these devices continues to get smaller, there is a need to develop new processes for achieving the target sizes.

SUMMARY

In accordance with some embodiments, a method of forming fins of a two-fin FinFET device includes forming mandrels with a lithographic etch process; forming sidewall spacers on the mandrels; and forming fins on the sidewall spacers, wherein the two-fin FinFET device is formed on each of the sidewall spacers.

A method of forming a multi-fin device, can include forming one or more mandrels with a first pitch and a first width; forming sidewall spacers on each side of the one or more mandrels, the sidewall spacers each having a second width; and forming fins on sides of the sidewall spacers, wherein the fins have a pitch of less than 20 nm.

These and other embodiments are more fully discussed below with respect to the following figures.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In the following description, specific details are set forth describing some embodiments. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the disclosure.

Figure 1A:
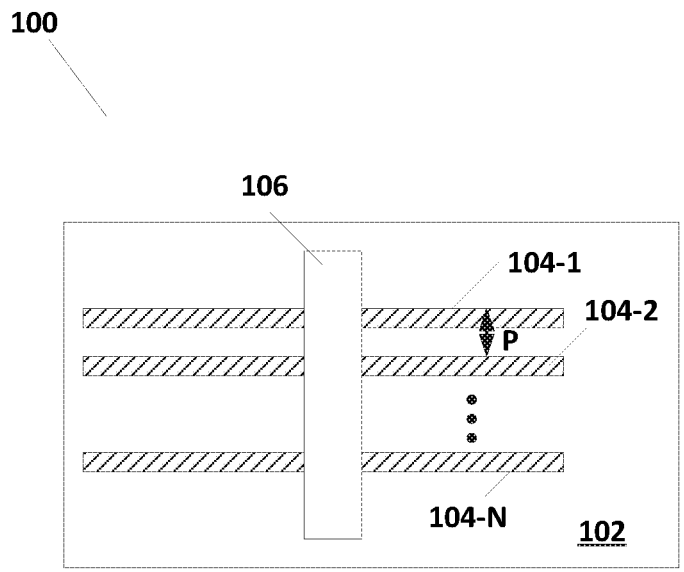
FIG. 1A shows a planar view of a multi-fin FinFET device.
Figure 1B:
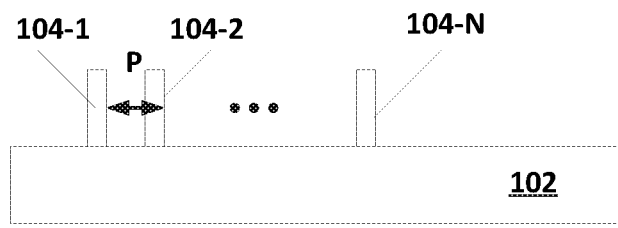
FIG. 1B shows a cross-sectional view of a multi-fin FinFET device.

FIGS. 1A and 1B illustrate a FinFET structure 100. As shown in the planar view of FIG. 1A, FinFET structure 100 includes one or more parallel fins 104-1 through 104-N formed on a substrate 102. A gate structure 106 is deposited over fins 104-1 through 104-N. Modem structures may include two or more fins 104 that are uniformly separated by a pitch P. The FinFET devices can be nMOS or pMOS devices, depending on the formation of fins 104-1 through 104-N. FIG. 1B illustrates a cross-sectional view of structure 100 illustrated in FIG. 1A. The pitch P is defined by the space between two fins and the width of the fin, as shown in FIG. 1A.

Although FinFET structure 100 illustrated in FIGS. 1A and 1B have increased the device density immensely, increasing the device density further leads to a need for small feature sizes and smaller pitches for the FinFET structures that are used. However, the technology has exceeded the limits of current lithographic technologies to produce FinFET structures with higher pitches. In particular, scaling the fin pitch to below 20 nm is desirable to scale logic cell height and thus overall chip sizes.

Modern lithography is wavelength limited in the production of devices with small features. Currently, 193 nm lithography is limited to feature sizes of about 80 nm. In other words, 193 nm lithographic processes can produce features with a minimum pitch, defined by the minimum feature width plus the minimum feature spacing, of about 80 nm using a single lithographic exposure and etch process. In order to obtain smaller pitch sizes, multiple patterning lithography (MPL) has been developed. Two forms of MPL have been attempted, one using repeated lithographic processes (litho-etch-litho-etch or LELE) techniques and another based on self-aligned spacer processing. In the production of fins for FinFET structures, the self-aligned spacer processing is favored. However, attaining smaller than 20 nm pitches has proven difficult due to the process limitations.

Self-aligned spacer processing is often referred to as self-aligned double processing (SADP). In SADP, a group of mandrels are formed lithographically by patterning and etching a mandrel material. Sidewall spacers can then be formed on the sidewalls of the mandrels. The formation of sidewall spacers can be accomplished by depositing material over the mandrel material, removing the deposited material on the horizontal surfaces, and removing the mandrel material leaving the sidewall spacers. Deposition of sidewall spacers can result in spacer widths that are much smaller than those available with lithographic formation of the mandrels. The sidewall spacers and mandrels can then be polished to expose the mandrels and the spacers used as an etch mask for removal of the remaining mandrel materials.

Consequently, the SADP process involves forming a spacer as a film layer on the sidewall of the pre-patterned mandrels, removing the spacer layer from the horizontal surfaces, and removing the originally patterned mandrel material leaving the spacers themselves. Since there are two side-wall spacers for every mandrel, the line density has now doubled. Consequently, SADP is applicable for defining narrow gates at half the original lithographic pitch. This spacer approach can, theoretically, be repeated to successively half the pitch between spacers. For example, a second SADP procedure, referred to as a self-aligned quadruple patterning (SAQP), can result in a pitch of a quarter that of the pitch of the originally formed mandrels.

Figure 2:
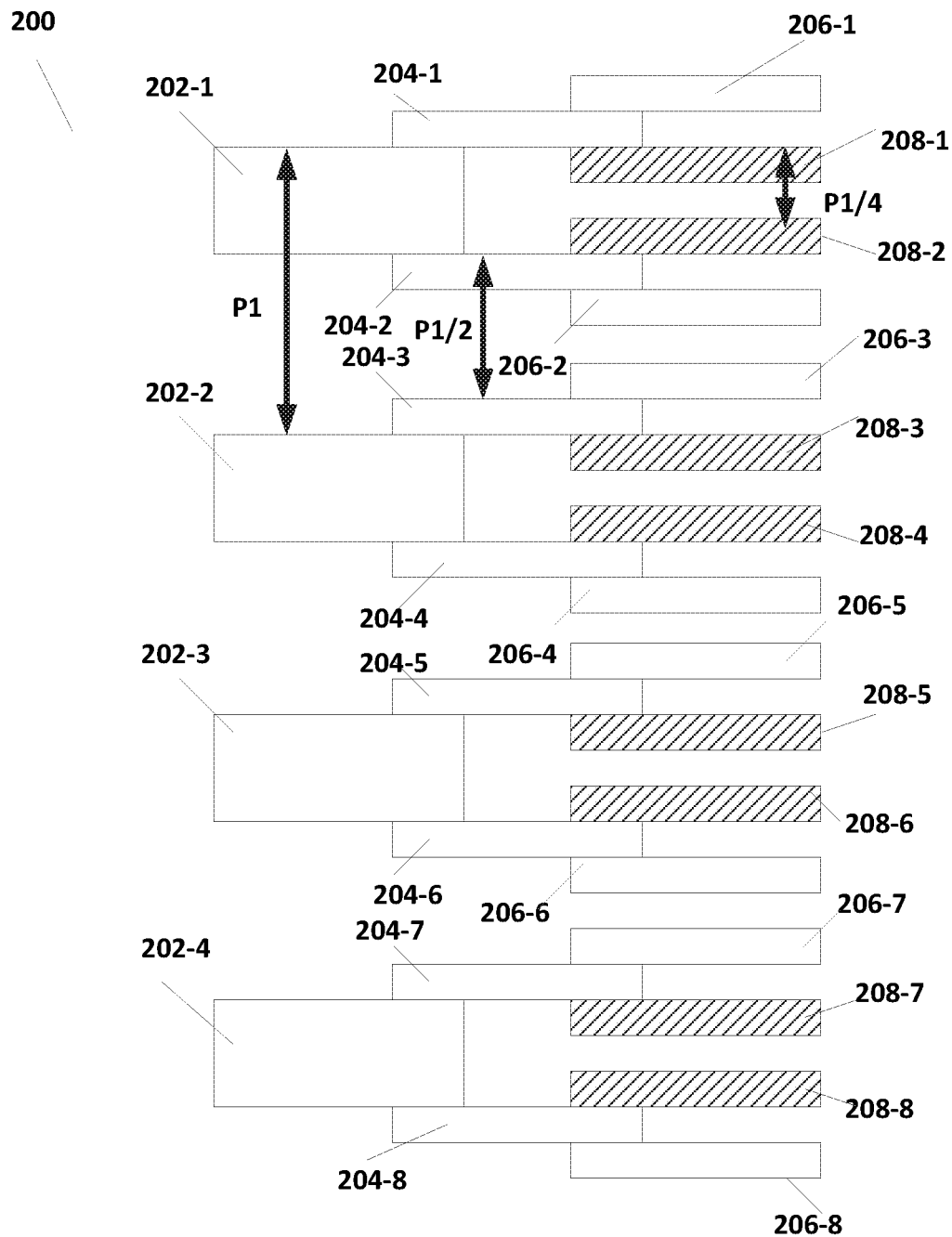
FIG. 2 illustrates an example process for producing a FinFET device.

FIG. 2 illustrates a SAQP process 200. As illustrated in FIG. 2, mandrels 202-1 through 202-4 are deposited with a pitch of P1. FIG. 2 illustrates mandrels 202-1 through 202-4, however any number of mandrels 202 may be formed. As discussed above, mandrels 202 are patterned and etched using a lithographic process.

Sidewall spacers 204-1 through 204-8 are then formed on mandrels 202-1 through 202-4 in an SADP process by deposition of sidewall materials on mandrels 202, removal of the sidewall materials on the horizontal surfaces, and etching to remove mandrels 202. As illustrated in FIG. 2, sidewall spacers 204-1 and 204-2 are formed on opposite sides of mandrel 202-1; sidewall spacers 204-3 and 204-4 are formed on opposite sides of mandrel 202-2; sidewall spacers 204-5 and 204-6 are formed on opposite sides of mandrel 202-3; and sidewall spacers 204-7 and 204-8 are formed on opposite sides of mandrel 202-4.

In a second SADP process on sidewall spacers 204, sidewall spacers 206-1 through 206-8 and fins 208-1 through 208-8 are formed on the sidewalls of sidewall spacers 204. As illustrated in FIG. 2, sidewall spacer 206-1 and fin 208-1 are formed on opposite sides of sidewall spacer 204-1; fin 208-2 and sidewall spacer 206-2 are formed on opposite sides of sidewall spacer 204-2; sidewall spacer 206-3 and fin 208-3 are formed on opposite sides of sidewall spacer 204-3; fin 208-4 and sidewall spacer 206-4 are formed on opposite sides of sidewall spacer 204-4; sidewall spacer 206-4 and fin 208-5 are formed on opposite sides of sidewall spacer 204-5; fin 208-6 and sidewall spacer 206-6 are formed on opposite sides of sidewall spacer 204-6; sidewall spacer 206-7 and fin 208-7 are formed on opposite sides of sidewall spacer 204-7; and fin 208-8 and sidewall spacer 206-8 are formed on opposite sides of sidewall spacer 204-8. Spacers 204-1 through 204-8 as well as spacers 206-1 through 206-8 are then removed, leaving fins 208-1 through 208-8. As such, fins 208-1 and 208-2 form part of a two-fin FinFET device; fins 208-3 and 208-4 form part of a two-fin FinFET device; fins 208-5 and 208-6 form part of a two-fin FinFET device; and fins 208-7 and 208-8 form part of a two-fin FinFET device. As is illustrated in FIG. 2, only one fin 208 is formed on each of sidewall spacers 206.

As is further illustrated in FIG. 2, at each successive SADP process, the pitch between deposited devices is halved. Consequently, if the pitch between mandrels 202 is P1, the pitch between spacers 204 is P1/2, and the final pitch between fins 208 that are in a single device is P1/4. Further, the pitch between devices is P1. Using the limitations of the 193 nm lithographic process, then P1 is 80 nm and the pitch between fins is 20 nm. Consequently, a SAQP as illustrated in FIG. 2 cannot produce a pitch size that is less than 20 nm between fins.

Figure 3:
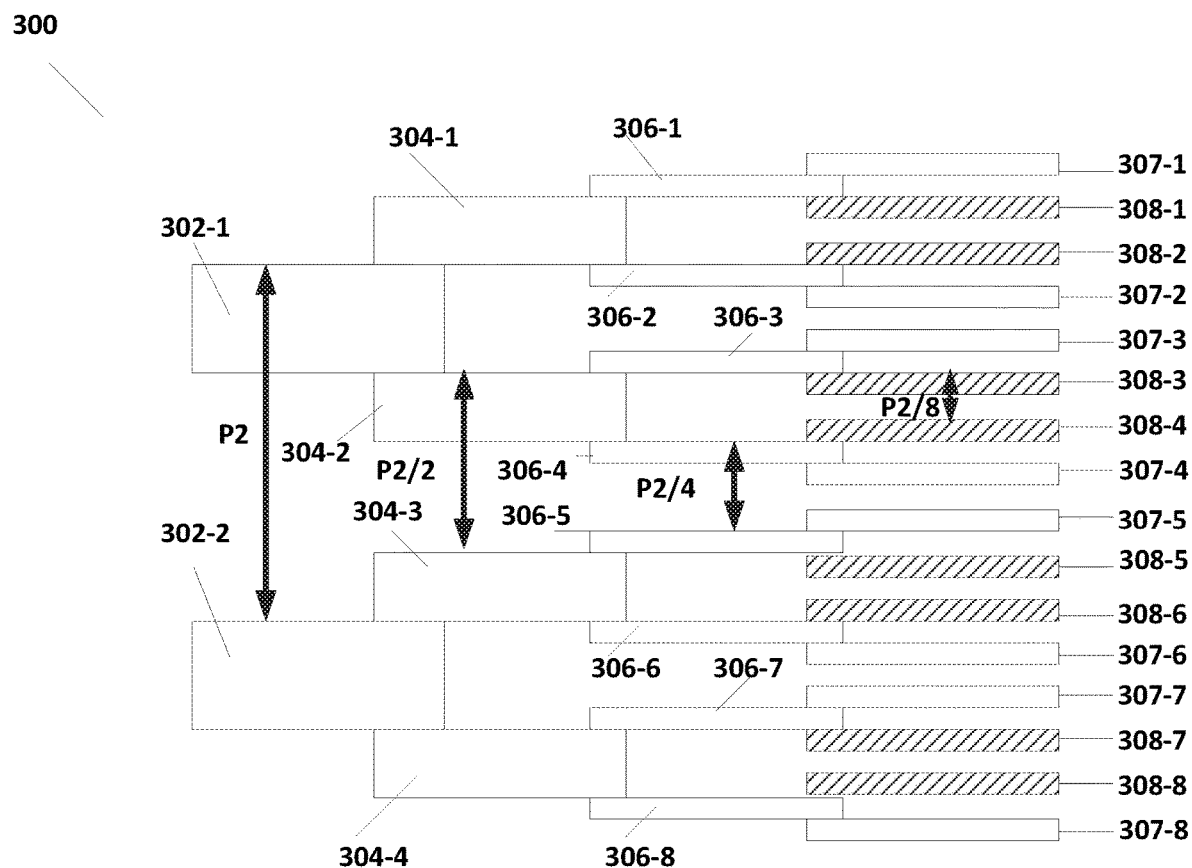
FIG. 3 illustrates another example process for producing a FinFET device.

FIG. 3 illustrates a self-aligned octuplet process (SAOP), which can achieve a less than 20 nm pitch with the 193 nm lithographic process. The SAOP is performed by three successive SADP processes, resulting in a pitch that is ⅛ that of the pitch between the mandrels. As illustrated in FIG. 3, a lithographic process is used to pattern mandrels 302-1 and 302-2. Mandrels 302 are deposited with a pitch of P2. As is illustrated in FIG. 3, in a first SADP process sidewall spacers 304 are then deposited on mandrels 302. Consequently, sidewall spacers 304-1 and 304-2 are formed on opposite sides of mandrel 302-1 and sidewall spacers 304-3 and 3-4-4 are formed on the opposite sides of mandrel 302-2. Mandrels 302 are then removed, leaving sidewall spacers 304. As illustrated in FIG. 3, sidewall spacers 304 have a pitch of P2/2. In a second SADP process, sidewall spacers 306 are formed on sidewall spacers 304 and sidewall spacers 304 removed. As shown in FIG. 3, sidewall spacers 306-1 and 306-2 are formed on opposite sides of sidewall spacer 304-1; sidewall spacers 306-3 and 306-4 are formed on opposite sides of sidewall spacer 304-2; sidewall spacers 306-5 and 306-6 are formed on opposite sides of sidewall spacers 304-3; and sidewall spacers 306-7 and 306-8 are formed on opposite sides of sidewall spacers 304-4. The pitch between sidewall spacers 306 is now P2/4.

In yet a third SADP process, sidewall spacers 307 and fins 308 are formed on sidewall spacers 306, after which both spacers 307 and spacers 306 are removed leaving fins 308. As shown in FIG. 3, sidewall spacer 307-1 and fin 308-1 are formed on opposite sides of sidewall spacer 306-1; fin 308-2 and sidewall spacer 307-2 are formed on opposite sides of sidewall spacer 306-2; sidewall spacer 307-3 and fin 308-3 are formed on opposite sides of sidewall spacer 306-3; fin 308-4 and sidewall spacer 307-4 are formed on opposite sides of sidewall spacer 306-4; sidewall spacer 307-5 and fin 308-5 are formed on opposite sides of sidewall spacer 306-5; fin 308-6 and sidewall spacer 307-6 are formed on opposite sides of sidewall spacer 306-6; sidewall spacer 307-7 and fin 308-7 are formed on opposite sides of sidewall spacer 306-7; and fin 308-8 and sidewall spacer 307-8 are formed on opposite sides of sidewall spacer 306-8. The resulting pitch between fins 308 and sidewall spacers 307 is, then, P2/8. Again, only one fin 308 is formed on each of sidewall spacers 306.

If P2 is, for example, 128 nm, then P2/2 is 64 nm; P2/4 is 32 nm; and P2/8 is 16 nm. Consequently, a pitch of 16 nm is achievable, with a device separation (after the removal of dummy fins or sidewall spacers 307 of 32 nm, using the SAOP process. However, the third SADP process required to achieve requires too many process steps, increasing costs and complicating the process, and is difficult to achieve within the constraints of materials depositions processes.

Figure 4:
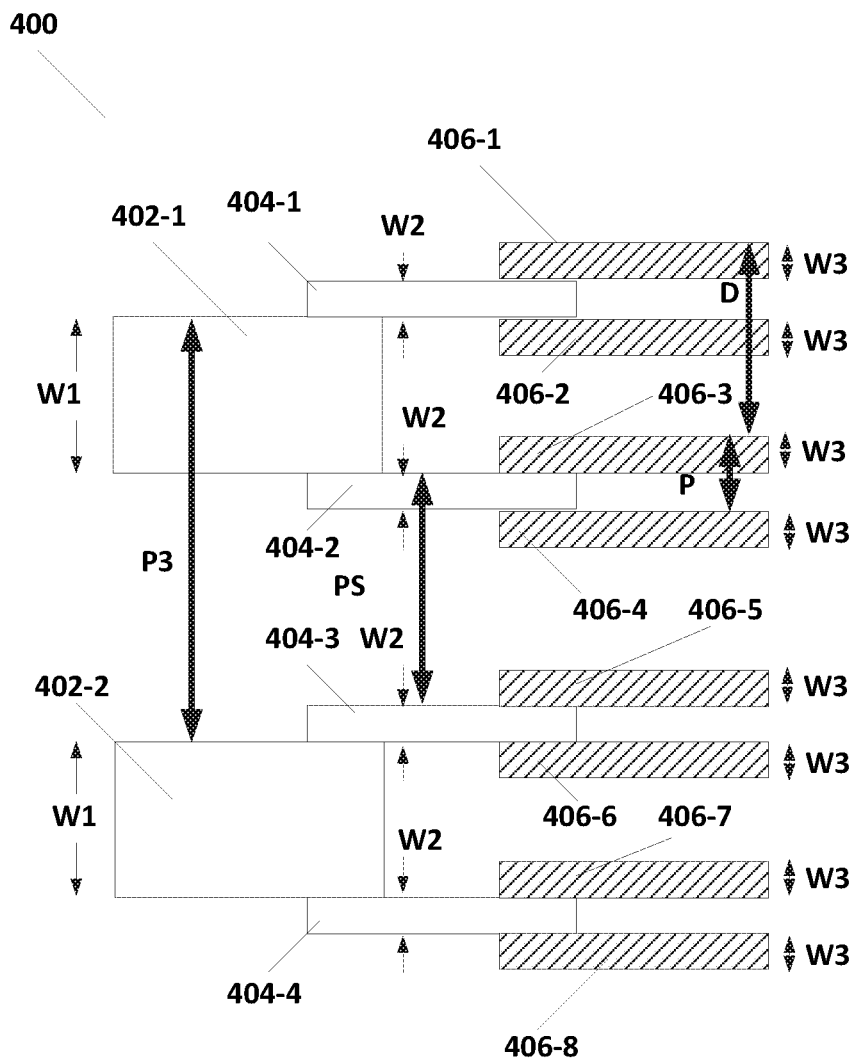
FIG. 4 illustrates an example process according to some embodiments of the present invention for producing a FinFET device.

FIG. 4 illustrates an example of a SAQP process according to some embodiments of the present invention for achieving a two-fin device with a pitch of less than 20 nm. As shown in FIG. 4, mandrels 402 are deposited in a lithographic process. Mandrels 402-1 and 402-2 are illustrated in FIG. 4. Mandrels 402-1 and 402-2 are deposited with a pitch P3 and width W1. Sidewall spacers 404 are deposited on the sidewalls of mandrels 402. Consequently, sidewall spacers 404-1 and 404-2 are formed on opposite sides of mandrel 402-1 and sidewall spacers 404-3 and 404-4 are formed on opposite sides of mandrel 402-2. However, instead of arranging the width W2 of sidewall spacers 404 such that a pitch between sidewall spacers 404 is P3/2, the width W2 of sidewall spacers 404 is arranged to affect the final pitch of fins 406.

As illustrated in FIG. 4, fins 406 are formed on the sidewalls of side-wall spacers 404. As illustrated, fins 406-1 and 406-2 are formed on opposite sides of sidewall spacer 404-1; fins 406-3 and 406-4 are formed on opposite sides of sidewall spacer 404-2; fins 406-5 and 506-6 are formed on opposite sides of sidewall spacer 404-3; and fins 406-7 and 406-8 are formed on opposite sides of sidewall spacer 404-4. In some embodiment, the width W2 of sidewall spacers 404 and the width W3 of fins 406 are the same.

As is further illustrated in FIG. 4, mandrels 402 may be formed with a pitch of P3. Fins 406 in each device have a pitch of P and devices have a pitch separation of D. As an example, the pitch P can be made 16 nm if the width W2 of sidewall spacers 404 and W2 of fins 406 sum to 16 nm. As an example, if W2 and W3 are both 8 nm, which is an achievable dimension for deposition of sidewall materials using a 7 nm process technology, then the pitch P is 16 nm. The pitch of sidewall spacers 404 PS can be arranged to be P3/2 by varying the width W1 of mandrels 402 and the width of spacers W2. The separation D between the resulting two-fin devices is given by the sum of W1 and W2. However, the spacing between mandrels 402 may not result in an even distance between each of sidewall spacers 404.

Consequently, as illustrated in FIG. 4, fins with small pitch, pitch less than 20 nm, are formed in a process that includes formation of mandrels 402 with a width of W1 and pitch of P3 with a lithographic etch process. Sidewall spacers 404 are formed by deposition of material on the sides of mandrels 402, and mandrel material is removed to leave sidewall spacers 404. Sidewall spacers 404 each have a width W2 and sidewall spacers have a pitch of PS. Fins 406 are then formed on the sidewall of spacers 404, with each spacer 404 providing for a single two-fin device formation. As a result, once spacers 404 are removed, none of the fins 406 deposited on the sidewall are removed (i.e. there is no dummy spacer removal). In some embodiments, the mandrel pitch P3 can be used to separate NMOS from PMOS FinFET devices.

The example embodiment of the present invention illustrated in FIG. 4 can produce fin pitches of less than 20 nm primarily because the fin pitch is dependent only on the ability to deposit sidewall spacers 404 and fins 406 within a particular width. In the 7 nm technologies, those deposition widths can be as low as 7 nm, and 8 nm widths or above are available. Separation between devices, D, remains dependent on the process limitations involved in forming mandrels 402.

Figure 5:
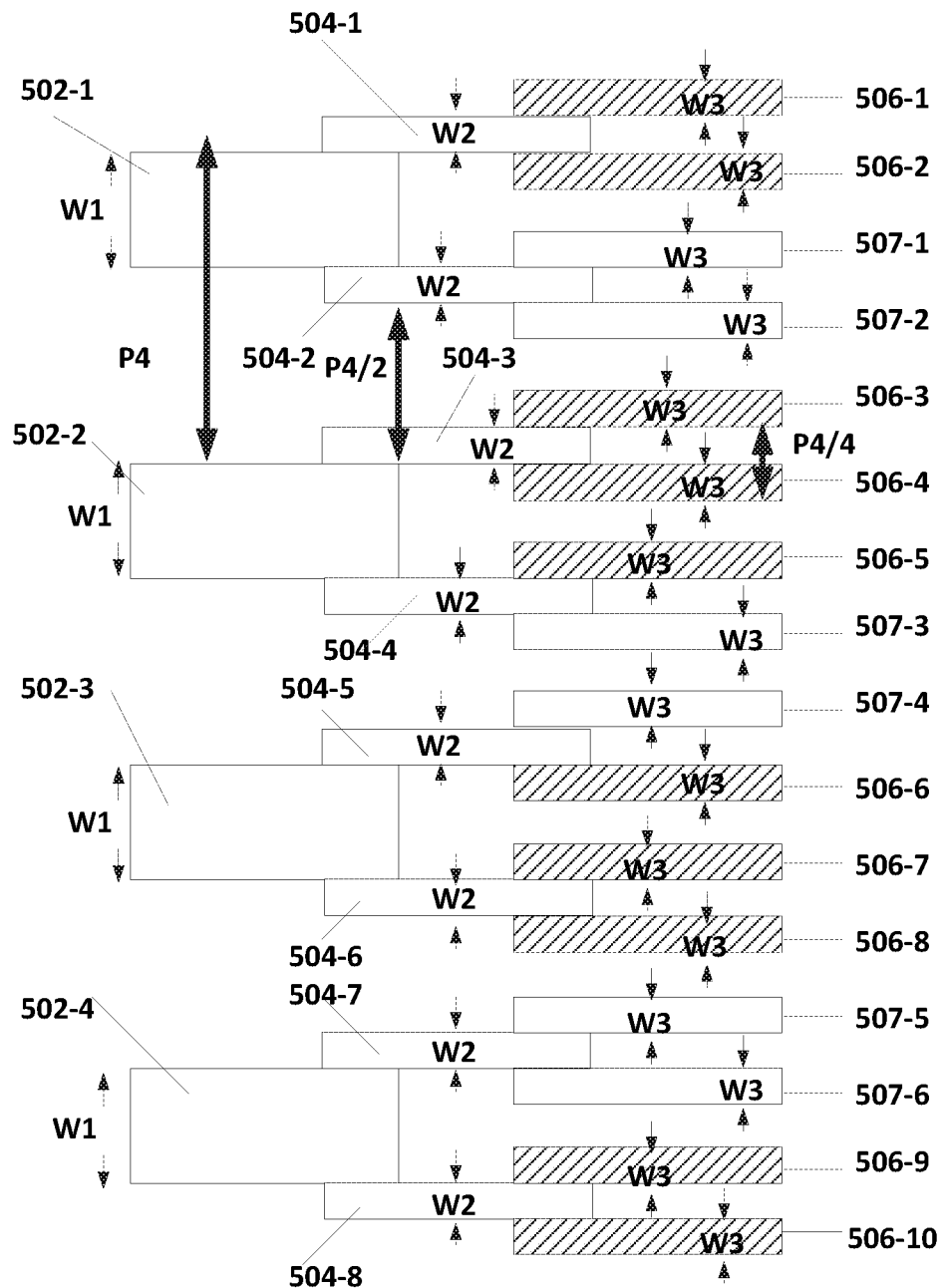
FIG. 5 illustrates another example process according to some embodiments of the present invention for producing a FinFET device.

FIG. 5 illustrates an example of a process according to some embodiments of the present invention for producing a multi-fin FinFET device where the number of fins is greater than two. Although, due to the limitations of the process technologies, fin pitches of less than 20 nm may not be easily achieved, the process illustrated in FIG. 5 can be used to produce multi-fin devices where the fin-pitch can be larger than 20 nm.

As shown in FIG. 5, mandrels 502 are formed with a lithographic and etch process. Mandrels 502 (mandrels 502-1 through 502-4 are illustrated) have a pitch of P4 and a width of W1, within the limits of resolution of the lithographic process. As is further shown, sidewall spacers 504 are formed on mandrels 502. In particular, sidewall spacers 504-1 and 504-3 are formed on opposite sides of mandrel 502-1; sidewall spacers 504-3 and 504-4 are formed on opposite sides of mandrel 502-2; sidewall spacers 504-5 and 504-6 are formed on opposite sides of mandrel 502-3; and 504-7 and 504-8 are formed on opposite sides of mandrel 502-4.

As is further illustrated, fins 506 and sacrificial sidewall spacers 507 are formed on sidewall spacers 504. FIG. 5 illustrates production of a 3-fin device, however, a four-fin device can also be produced using sidewalls 504 on a single mandrel 502. A device with more than four fins can be produced using sidewalls 504 from adjacent mandrels 502.

In the example 3-fin device illustrated in FIG. 5, fins for each device may span adjacent mandrels 502. As illustrated in FIG. 5, fins 506-1 and 506-2 are formed on opposite sides of sidewall spacer 504-1. Sacrificial spacers 507-1 and 507-2 formed on opposite sides of sidewall spacer 504-2 during the formation of fins 506 and removed. Fins 506-3 and 506-4 are formed on opposite sides of sidewall spacer 504-3 and fin 506-5, which forms the third fin of a device that includes fins 506-3, 506, and 506-5, is formed on a first side of sidewall spacer 504-4. Sacrificial spacer 507-3 is formed on a second side of sidewall spacer 504-4. As is further illustrated in FIG. 5, sacrificial sidewall spacer 507-4 and fin 506-6 are formed on opposite sides of sidewall spacer 504-5; fins 506-7 and 506-8 are formed on opposite sides of sidewall spacer 504-6; sacrificial sidewall spacers 507-5 and 507-6 are formed on opposite sides of sidewall spacer 504-7; and fins 506-9 and 506-10 are formed on opposite sides of sidewall spacer 504-8.

Consequently, as illustrated in FIG. 5, provided that a larger fin-pitch can be tolerated, devices with more than two fins can be formed according to some embodiments of the present invention. As illustrated in FIG. 5, the spacing between fins 506 is determined by width W2 of sidewall spacer 504. Consequently, the fin pitch, which is shown as P4/4 as an example in FIG. 5, is given by the sum of the width W2 of sidewall spacer 504 and the width W3 of sidewall spacer w3. The width of mandrel 502, W1, can be adjusted to produce an overall pitch of P4/4 for the multi-fin device. In some embodiments, the width of spacers 504, W2, and the width of fins 506, W3, are the same.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A method of forming one or more two-fin FinFET devices, comprising:
   forming one or more mandrels with a lithographic etch process;
   forming at least one sidewall spacer on at least one vertical side of each of the one or more mandrels after formation of the one or more mandrels;
   removing the one or more mandrels after formation of the at least one sidewall spacer; and
   forming two fins, one on each of the opposing vertical sides of the at least one sidewall spacer after formation of the at least one sidewall spacer, to form two fins of the two-fin FinFET device,
   wherein fins of each two-fin FinFET device is formed on opposing vertical sides of the at least one sidewall spacer formed on one of the mandrels.

2. The method of claim 1, wherein a pitch of the two-fin FinFET device is less than 20 nm.

3. The method of claim 1, wherein separation between a pair of the two-fin FinFET devices is determined by a width of the mandrel.

4. The method of claim 1, wherein a distance between adjoining mandrels separates nMOS FinFET devices from pMOS FinFET devices.

5. The method of claim 1, wherein a pitch of the two-fin FinFET device is determined by a sidewall spacer width and a fin width.

6. The method of claim 1, further including removing the sidewall spacers after forming the fins.

7. A method of forming a multi-fin device, comprising:
forming one or more mandrels with a first pitch, each of the one or more mandrels having a first width;
forming sidewall spacers on each vertical side of the one or more mandrels after formation of the one or more mandrels, the sidewall spacers each having a second width;
removing the one or more mandrels after formation of the sidewall spacers; and
forming multiple-fin structures by forming fins on vertical sides of the sidewall spacers of a single mandrel of the one or more mandrels after forming the sidewall spacers,
wherein the fins formed on the single mandrel have a pitch of less than 20 nm, and
wherein multi-fin devices are separated at least by the first pitch.

8. The method of claim 7, wherein the mandrels are formed with a lithographic exposure and etch process.

9. The method of claim 7, wherein the sidewall spacers and the fins are deposited with materials deposition technology.

10. The method of claim 9, wherein the materials deposition technology is a 7 nm technology.

11. The method of claim 7, further including removing the sidewall spacers to leave the fins.

12. The method of claim 7, wherein the multi-fin device is a two-fin device, the two fin device formed on one of the sidewall spacers.

13. The method of claim 12, wherein adjacent two-fin devices are separated according to the width of the mandrel.

14. The method of claim 7, wherein the multi-fin device includes more than two fins formed on adjacent sidewall spacers of the single mandrel.

* * * * *